United States Patent [19]
Piano

[11] Patent Number: 6,090,493
[45] Date of Patent: *Jul. 18, 2000

[54] BISMUTH COATING PROTECTION FOR COPPER

[75] Inventor: Anthony M. Piano, Lodi, N.J.

[73] Assignee: Fry's Metals, Inc., Providence, R.I.

[ * ] Notice: This patent is subject to a terminal disclaimer.

[21] Appl. No.: 08/704,510

[22] PCT Filed: Mar. 17, 1995

[86] PCT No.: PCT/US95/03574

§ 371 Date: Dec. 26, 1996

§ 102(e) Date: Dec. 26, 1996

[87] PCT Pub. No.: WO95/25008

PCT Pub. Date: Sep. 21, 1995

Related U.S. Application Data

[63] Continuation-in-part of application No. 08/214,050, Mar. 17, 1994, abandoned.

[51] Int. Cl.$^7$ .................. B32B 9/00; B05D 5/12
[52] U.S. Cl. ............ 428/469; 428/457; 106/1.22; 106/1.23; 106/1.25; 106/1.26; 427/98
[58] Field of Search .................. 428/469, 457; 106/1.22, 1.23, 1.25, 1.26; 427/98

[56] References Cited

U.S. PATENT DOCUMENTS

| | | | |
|---|---|---|---|
| 3,268,353 | 8/1966 | Melillo | 428/612 |
| 3,303,029 | 2/1967 | Shipley | 106/1.25 |
| 3,615,892 | 10/1971 | Heinzelman, Jr. | 428/639 |
| 3,615,897 | 10/1971 | Banush | 428/642 |
| 4,014,660 | 3/1977 | Schreiner et al. | 428/646 |
| 5,306,335 | 4/1994 | Senda et al. | 106/1.25 |
| 5,554,700 | 9/1996 | Schipfer et al. | 525/360 |

*Primary Examiner*—Deborah Jones
*Assistant Examiner*—Cathy F. Lam
*Attorney, Agent, or Firm*—Vorys, Sater, Seymour and Pease LLP

[57] ABSTRACT

Copper-containing surfaces, such as a copper surface for use in an electrical circuit, are protected by the provision of a bismuth coating.

43 Claims, No Drawings

BISMUTH COATING PROTECTION FOR COPPER

This application is a continuation-in-part of application Ser. No. 08/214,050 filed Mar. 17, 1994 (now abandoned).

FIELD OF THE INVENTION

The present invention is related to the protection of copper-containing surfaces, and is more particularly concerned with the novel use of protective bismuth coatings for such surfaces and with methods of coating application. The invention is especially advantageous in connection with the protection of copper surfaces of substrates used in electronics assembly, such as printed circuit substrates.

BACKGROUND OF THE INVENTION

The use of protective coatings for copper-containing surfaces is well known. Coatings may be applied for such purposes as to prevent tarnishing, to improve/preserve solderability, to improve corrosion resistance, and to reduce contact resistance between mating parts.

Printed circuit substrates for electronics applications, for example, generally include copper connectors such as copper pads for the mounting of surface-mount type electronic devices and/or copper plated through holes for receiving the leads of pin-in-hole type electronic devices. The surfaces of such connectors are commonly provided with a lead-tin alloy coating in practice. Tin-containing coatings are problematic, however, in that they may degrade with time due to the formation of copper-tin intermetallics. These intermetallic compounds form at the boundary between the copper and tin-containing coating and grow through the coating. The inter-metallic compounds form even at room temperature. Heating, such as during soldering, serves to accelerate the process. The problem of intermetallic compound formation becomes even more significant in connection with emerging electronics manufacturing technologies, wherein printed circuit substrates are subjected to multiple heating cycles.

Organic coatings, such as imidazoles, benzimidazoles, and triazoles have been considered as possible alternatives to lead-tin coatings. However, such coatings are subject to oxidation or volatilization when exposed to the heat of electronics manufacturing processes, with a resultant loss of protection. Moreover, organic coatings fall short of hole-fill requirements after wave soldering, particularly with the use of no-clean type soldering fluxes which are seeing increasing use in the electronics industry.

SUMMARY OF THE INVENTION

In accordance with the present invention, it has been discovered that the above-discussed deficiencies of tin-containing and organic coatings can be overcome, and that superior and cost-effective surface protection can be achieved, through the use of bismuth as a protective coating material. Bismuth has been found to provide a number of significant advantages over tin-containing and organic coatings. Unlike tin-containing coatings, bismuth does not form intermetallics with copper. Thus, a bismuth coating is not subject to the degradation by intermetallics which characterizes tin-containing coatings. Bismuth is also not subject to the oxidation/volatilization problems which characterize organic coatings. Furthermore, due to its high surface energy, bismuth exhibits highly effective wetting during wave soldering, drawing molten solder up into plated through-holes by capillary force to provide excellent hole-fill. When a bismuth coating is applied by so-called immersion plating, as described hereinafter, the invention achieves a very flat coating which is ideally suited for surface mount assembly.

Thus, in accordance with one of its principal aspects, the present invention provides an article having a copper-containing surface coated with bismuth.

In accordance with another of its principal aspects, the invention provides a method of protecting a copper-containing surface, comprising the step of coating the surface with bismuth.

In accordance with another of its principal aspects, the invention provides a method of protecting a copper-containing surface, comprising the step of coating the surface with a metallic coating which does not form intermetallics with copper of the surface and which contains bismuth.

In accordance with still another of its principal aspects, the invention provides a method of protecting a copper-containing surface, wherein the surface is treated with a solution containing an acid solubilized bismuth salt.

In accordance with still another of its principal aspects, the invention provides a bismuth coating composition, comprising an acid soluble bismuth salt and an acid.

In accordance with still another of its principal aspects, the invention provides a protective coating, comprising a bismuth deposition from an immersion plating bath containing an acid solubilized salt of bismuth.

The foregoing and other aspects of the invention will be more fully appreciated from the description of the preferred embodiments hereinafter.

DESCRIPTION OF THE PREFERRED EMBODIMENTS

The present invention will now be described in detail with respect to the illustrative case of protecting a copper surface, such as of a printed circuit substrate or the like, although it will be readily appreciated that the invention is not limited to such applications.

Broadly speaking, in accordance with the preferred practice of the invention, bismuth is deposited on the copper surface in an immersion plating bath (solution) containing a bismuth salt and an acid. Immersion plating is a well known process which involves the use of a plating bath containing one or more ingredients which act to change the relative electropotentials of the base metal and the plating metal such that a plating reaction proceeds in which atoms on the surface of the base metal are displaced by atoms of the plating metal, thereby forming a deposit of the plating metal on the base metal. Although other coating techniques, such as electroplating or electroless plating, may be useful to provide a bismuth coating on copper or copper-containing surfaces, the immersion plating process is preferred in the practice of the invention because it requires no external electric current and no reducing agent for metal deposition to occur, in addition to providing a very flat coating which is highly desirable for surface mounting of components.

The bismuth used in the coating solution of the present invention is preferably in the form of a bismuth salt such as bismuth trioxide, and the like. The bismuth salt is dissociated in an acidic solution to form bismuth ions that are then deposited on the copper surface.

Preferred coating solutions in accordance with the present invention are generally strongly acidic, with a pH most preferably less than 1, and contain halide, such as chloride or bromide. Although the invention may be practiced with plating solutions of higher pH, the plating rate will be reduced. The pH should ordinarily be less than about 3. A pH exceeding 4 is not preferred, because at such levels satisfactory bismuth plating rate and coating thickness may not be achieved. It is noteworthy that the preferred low pH formulations in accordance with the invention are characteristically stable and therefore do not require the addition of stabilizers, such as ammonium ion and the like.

The halide is quite conveniently provided as a constituent of the acid, hydrochloric acid being preferred. Another suitable halogen-acid is hydrobromic acid. The acid solubilizes the bismuth salt, and the halide raises the potential of the copper above that of bismuth, thus allowing the plating reaction to proceed. (It is known that halides complex with copper in strongly acidic conditions.) The use of non-halogen acids, such as sulfuric acid, would of course require a suitable supplemental source of halide, as will be appreciated by those skilled in the art. The halide is present in an amount effective to cause the bismuth to plate substantially uniformly over the entire copper surface to be coated, preferably in an amount substantially in excess of the stoichiometric amount (of bismuth).

It has been found in the practice of the invention that exposure of the copper surface to iodide greatly enhances the adhesion of the deposited bismuth coating, as well as significantly improving the metallic appearance of the coating. The mechanism by which these improved properties are brought about is not fully understood. It is believed, however, that the iodide complexes with the copper surface and operates to direct the course of the plating reaction so as to ensure optimum crystal structure of the subsequent bismuth deposit. The iodide is preferably provided in the form of potassium iodide, sodium iodide, hydriodic acid, or organic iodide. The iodide may be added either directly to the plating solution, or to a pre-plating solution with which the copper surface is treated prior to immersion plating. When the iodide is incorporated directly in the plating solution, a concentration, as iodide, of from about 0.04 to about 4 g/l is preferred, with from about 0.1 to about 0.2 g/l being most preferred.

Wetting agents, preferably in an amount less than 1 g/l, may be added to lower the surface tension of the solution and to ensure uniform wetting of surfaces.

Basic parameters of preferred plating bath formulations of the invention are as follows:

| | |
|---|---|
| Bismuth Salt | 5–20 g/l |
| Halogen Acid (concentrated) | 50–500 ml/l |
| Iodide (as iodide) | 0–4 g/l |
| Wetting Agent, etc. | <1 g/l |
| Deionized Water | (remainder) |
| pH | <1 (most preferred) |
| Operating Temperature | 120°–200° F. (140°–160° F. most preferred) |
| Immersion Time | 30 sec–5 min |

The following parameters are exemplary of specific working baths in accordance with the foregoing basic parameters:

| | |
|---|---|
| Bismuth Trioxide | 5–20 g/l |
| Hydrochloric Acid, 37% | 50–200 ml/l |
| Potassium Iodide | .05–5.0 g/l |
| Wetting Agent | 0–1 g/l |
| Deionized Water | (remainder) |
| pH | <1 |
| Operating Temperature | 120°–200° F. |
| Immersion Time | 30 sec–5 min |

Grain refiners and other additives may also be used in minor amounts, typically less than 1 g/l, as required to obtain the desired characteristics. Crystal structure, deposit properties and thickness can be modified by varying the above operating parameters.

Although not essential to the practice of the present invention, the addition of certain completing agents allows for the adjustment of the deposition rate and modification of the metallic characteristics and the durability of the deposited bismuth coating. A modified version of the basic immersion plating formula can be prepared by incorporating glycolic acid, monoethanolamine (or monoethanolamine hydrochloride), N-Methyl pyrolidone or combinations thereof.

Such complexing agents or combinations of said completing agents apparently act to control the crystal growth of the subsequent deposit, probably by altering the reaction path at the reaction interface. The microfine grain structure so produced may be preferable over that produced with the basic formulation. An exemplary concentration range of from about 5 percent to about 30 percent total of said complexing agent(s) is preferred, although other concentrations as well as other complexing agents are also contemplated as being within the scope of the present invention.

By stripping bismuth coated coupons of known area and using subsequent standard UV/Vis analysis techniques, coating thickness has been measured between 1 micro-inch and 10 micro-inches, depending on plating bath composition, operating temperature and immersion time.

In addition to the immersion bismuth itself, standard pre-treatment steps such as cleaning and copper microetching should be performed to ensure good adhesion of the bismuth deposit to the copper surfaces.

A further understanding of the present invention is presented in the following non-limiting examples.

EXAMPLE 1

Three 3½"×4" FR-4 test panels were processed using the present invention. Each panel contained 50 plated through-holes of various diameters for hole-fill evaluation after wave solder and solid copper pad areas for solderability testing. The panels were all processed using the following sequence of operations:

1. Clean (1 minute)
2. Tap Water Rinse (30 seconds)
3. Microetch (2 minutes)
4. Tap Water Rinse
5. Sulfuric Acid, 10% (30 seconds)
6. Tap Water Rinse
7. Immersion Bismuth (1 minute)
8. Tap Water Rinse (30 seconds)
9. Dry Bath 1 was a room temperature isopropanol rinse. Its purpose was to remove fingerprints, grease and other contaminants from copper surfaces. Those skilled in the art will appreciate that other suitable acid or alkaline cleaning systems may be substituted.

Bath 3 contained 100 g/l of sodium persulfate and ½% by volume concentrated sulfuric acid. The remainder was deionized water. Its purpose was to remove about 40 microinches of copper from the test substrate in order to ensure proper adhesion of the subsequent bismuth deposit. This bath was also used at room temperature. Those skilled in the art will appreciate that other types of microetchants, including, but not limited to, sulfuric acid/hydrogen peroxide and ferric chloride based systems may be substituted.

Bath 5 contained 10% by volume concentrated sulfuric acid. The remainder was deionized water. Its purpose was to remove any persulfate residue remaining on the copper surfaces from bath 3. This bath was used at room temperature.

Bath 7 was prepared by solubilizing 5 g of bismuth trioxide in 50 ml of hydrochloric acid, 37%. Sufficient water to make 1 liter was then added. 1.25 g of potassium iodide was added to the final solution. The bath, which had a pH of 0.65, was then heated to 160° F. (71° C.).

Baths 2, 4, 6 and 8 were flowing rinses to prevent carryover of chemicals from previous baths.

Following this process sequence, the test panels were then subjected to 0, 1, 2, and 3 IR reflow cycles to simulate solder paste application and other assembly processes. The following parameters were used for each cycle:

Preheat: 110° C. Conveyor Speed: 13.2 in/min

| Heat Stage | Top | Bottom |
| --- | --- | --- |
| 1 | 125° C. | 125° C. |
| 2 | 200° C. | 200° C. |
| 3 | 325° C. | 325° C. |

Following IR cycling, the test panels were roller coated with NR 300 A2 water based no-clean flux. This flux is available from Alpha Metals, Inc., Jersey City, N.J.

The panels were then passed through a wave solder machine at 5.00 feet per minute. The three preheat stations were each set at 375° F. The solder temperature was 500° F. After wave solder the following observations were made regarding hole-fill and solderability.

| IR Cycles | Hole-Fill (%) | Solderability |
| --- | --- | --- |
| 0 | 100 | Excellent |
| 1 | 100 | Excellent |
| 2 | 100 | Excellent |
| 3 | 90 | Excellent |

% hole-fill refers to the number of holes that exhibit complete solder filling from one side of the panel to the other side (with total land wetting) divided by the total number of holes in the panel times 100.

EXAMPLE 2

An identical test panel substrate was treated as in Example 1 to form a substantially uniform bismuth deposit in the through-holes and on the copper surfaces. However, the potassium iodide was applied in a separate solution prior to the bismuth plating solution. This pre-plating solution was prepared as follows:

dissolve approximately 5 g per liter of potassium iodide in deionized water;

add approximately 50 ml per liter of hydrochloric acid to said solution;

heat said solution to approximately 150° F.

The test substrate was pre-cleaned as in Example 1, immersed in this pre-plating solution for 5 minutes, rinsed in tap water and then immersed in the bismuth plating solution as in Example 1 but without the added potassium iodide. Hole-fill and solderability tests were accomplished as described in Example 1 with comparable results.

EXAMPLE 3

An identical test panel substrate was treated as in Example 1 to form a substantially uniform bismuth coating in the through-holes and on the copper surfaces. The bismuth plating solution was prepared by substituting bismuth (III) chloride for bismuth (III) trioxide on a mole for mole basis. Hole-fill and solderability tests were accomplished as in Example 1 with comparable results.

EXAMPLE 4

An identical test panel substrate was treated as in Example 1 to form a substantially uniform bismuth deposit in the through-holes and on the copper surfaces of the substrate. However, the immersion plating solution of bath 7 was prepared as follows:

solubilize 5 grams of bismuth trioxide in 200 ml of hydrochloric acid, 37%;

add 100 grams of glycolic acid, 70% to said solution;

add 100 grams of N-Methyl Pyrolidone to said solution;

add 100 grams of monoethanolamine to said solution;

add 1 gram of potassium iodide to said solution;

add sufficient deionized water to make 1 liter of said solution (pH=0.95);

heat said solution to approximately 150° F.

The test substrate was pre-cleaned as in Example 1, immersed in this plating solution for 2 minutes, rinsed in tap water and dried. Subsequent examination of the resultant deposit showed it to be uniform, shiny and more metallic in appearance than that obtained in Example 1. Hole-fill and soldering tests were also accomplished as in Example 1 with comparable results.

In accordance with an especially surprising discovery of the present invention, it has been found that the pre-addition of copper ions to the immersion plating solution significantly enhances the bismuth deposit thickness (plating rate) and that the resistance of the deposit to humidity aging at 85° C./85% relative humidity is correspondingly increased. The propensity for color shift from grayish toward pink, which is directly related to humidity aging, is also significantly reduced. Copper can be added as any type of soluble salt including but not limited to copper chloride, copper sulfate, copper acetate, etc. Copper additions up to amounts in excess of 1,000 ppm are effective. Added copper concentrations of 250–500 ppm, for instance, provide excellent results, as will be evident from Example 5.

EXAMPLE 5

Test coupons that were coated from a fresh solution, i.e., no added copper, exhibited visual color change after two weeks at ambient conditions, while coupons coated using solutions containing 250 and 500 ppm of copper remained totally gray after about 10 weeks under the same ambient conditions. The coating solutions had the same basic formulation as given in Example 1, except that 5 g/l of EDTA was added as a complexing agent. Coating was conducted in accordance with the procedure set forth in Example 1.

The bismuth deposit thickness measurements as a function of plating time and copper concentration are as follows:

| | Deposit Thickness (micro-inches) | | |
|---|---|---|---|
| | Copper Concentration (ppm) | | |
| Plating Time (seconds) | 0 (Fresh) | 250 | 500 |
| 15 | 2.5 | 6.7 | 9.8 |
| 45 | 3.2 | 6.3 | 9.1 |
| 75 | 3.9 | 5.5 | 11.8 |

While preferred embodiments of the present invention have been described herein, it will be appreciated by those skilled in the art these are merely exemplary, and that many changes and modifications may be made in keeping with the spirit and principles of the invention, the scope of which is defined in the appended claims.

What is claimed is:

1. A coating composition that is effective for immersion plating a coating of bismuth metal onto a copper containing surface, said composition comprising an acid solubilized bismuth salt, an iodide, and optionally copper, and having a pH not exceeding 4.

2. The coating composition of claim 1, wherein said bismuth salt is selected from the group consisting of bismuth trioxide and bismuth chloride.

3. The coating composition of claim 1, wherein said acid is selected from the group consisting of hydrochloric acid and hydrobromic acid.

4. The coating composition of claim 1, in the form of an aqueous solution.

5. The coating composition of claim 1, wherein said iodide is selected from the group consisting of potassium iodide, sodium iodide, hydriodic acid, and organic iodide.

6. The coating composition of claim 1, further comprising a completing agent.

7. The coating composition of claim 6, wherein said complexing agent is selected from the group consisting of glycolic acid, N-methyl pyrolidone, monoethanolamine, and monoethanolamine hydrochloride.

8. The coating composition of claim 1, further comprising halide in excess of a stoichiometric amount of bismuth.

9. The coating composition of claim 1, further comprising a predetermined addition of copper in a concentration effective to enhance a bismuth plating rate of the composition.

10. The coating composition of claim 1, wherein the pH is less than 1.

11. A protective coating, comprising a bismuth metal deposition immersion-plated from the composition of claim 1.

12. The protective coating of claim 11, having a thickness of from about 1 micro-inch to about 10 micro-inches.

13. The coating composition of claim 9, wherein the concentration of copper is 250–500 ppm.

14. A method of protecting a copper-containing surface, comprising:

providing a coating composition in accordance with any one of claims 1, 8, 9, and 10; and immersing said surface with said coating composition to form a deposit of bismuth metal on said surface.

15. The method of claim 14, wherein said surface is a copper surface for use in an electrical circuit.

16. The method of claim 14, wherein said bismuth salt is solubilized in an acid selected from the group consisting of hydrochloric acid and hydrobromic acid.

17. The method of claim 14, wherein said coating composition is heated.

18. A coating composition that is effective for immersion plating a coating of bismuth metal onto a copper-containing surface and that consists essentially of bismuth salt, halogen acid, water, and optionally one or more of iodide, complexing agent, and copper.

19. The coating composition of claim 18, wherein an iodide is present.

20. The coating composition of claim 19, wherein said iodide is selected from the group consisting of potassium iodide, sodium iodide, hydriodic acid, and organic iodide.

21. The coating composition of claim 18, wherein at least one complexing agent is present.

22. The coating composition of claim 21, wherein said complexing agent is selected from the group consisting of glycolic acid, N-methyl pyrolidone, monoethanolamine, and monoethanolamine hydrochloride.

23. The coating composition of claim 18, wherein both an iodide and at least one complexing agent are present.

24. The coating composition of claim 23, wherein said iodide is selected from the group consisting of potassium iodide, sodium iodide, hydriodic acid, and organic iodide.

25. The coating composition of claim 23, wherein said complexing agent is selected from the group consisting of glycolic acid, N-methyl pyrolidone, monoethanolamine, and monoethanolamine hydrochloride.

26. The coating composition of claim 18, wherein the halogen acid includes an acid selected from the group consisting of hydrochloric acid and hydrobromic acid.

27. The coating composition of claim 18, and having a pH not exceeding 4.

28. The coating composition of claim 27, wherein the pH is less than 1.

29. The coating composition of claim 18, containing a predetermined addition of copper in a concentration effective to enhance the bismuth plating rate of the composition.

30. A protective coating, comprising a bismuth metal deposition immersion-plated from the composition of any one of claims 18 and 29.

31. The protective coating of claim 30, having a thickness of from about 1 micro-inch to about 10 micro-inches.

32. The coating composition of claim 29, wherein the concentration of copper is 250–500 ppm.

33. A method of protecting a copper-containing surface, comprising:

providing a coating composition in accordance with any one of claims 18, 19 and 29; and immersing said surface with said coating composition to form a deposit of bismuth metal on said surface.

34. The method of claim 33, wherein said surface is a copper surface for use in an electrical circuit.

35. A method of protecting a copper-containing surface, comprising:

immersing said surface with a pre-plating solution containing iodide; and after said immersing with said pre-plating solution, immersing said surface with a plating solution containing a bismuth salt dissolved in an acid, and water, and optionally one or more of iodide, complexing agent and copper, to form a bismuth metal coating on said surface.

36. The method of claim 35, wherein said surface is a copper surface for use in an electrical circuit.

37. The method of claim 35, wherein said surface is cleaned and etched prior to immersion in said pre-treating solution.

38. The method of claim 35, wherein said plating solution has a pH not exceeding 4.

39. The method of claim 38, wherein the pH of said plating solution is less than 1.

40. The method of claim 35, wherein said plating solution contains halide.

41. The method of claim 40, wherein the halide is a constituent of a halogen acid.

42. The method of claim 40, wherein the halide is present in excess of a stoichiometric amount of bismuth.

43. The method of claim 35, wherein said plating solution contains a complexing agent.

* * * * *